United States Patent [19]

Britz

[11] Patent Number: 4,795,988
[45] Date of Patent: Jan. 3, 1989

[54] LOW DISTORTION OSCILLATOR

[76] Inventor: William J. Britz, 21032 107th Ave. SE., Snohomish, Wash. 98290

[21] Appl. No.: 932,791

[22] Filed: Nov. 18, 1986

[51] Int. Cl.$^4$ ............................................. H03B 5/20
[52] U.S. Cl. ................................... 331/135; 331/183
[58] Field of Search ................ 331/109, 135, 136, 183

[56] References Cited

U.S. PATENT DOCUMENTS 4,560,958 12/1985 Hofer ................................... 331/135

Primary Examiner—Eugene R. LaRoche
Assistant Examiner—Robert J. Pascal

[57] ABSTRACT

A DC voltage is synthesized from a combination of a plurality of N phases of an oscillator signal. A diode circuit is used to combine the N phases, and a relationship between components of the circuit is established to eliminate the Nth harmonic of the oscillator signal from the synthesized DC voltage. Provision of non-zero input series resistances for four diodes together with a non-zero summing output resistance therefor provides a DC voltage having no harmonics below the eighth harmonic for a double-integrating oscillator providing four equally displaced phases of a signal.

19 Claims, 2 Drawing Sheets

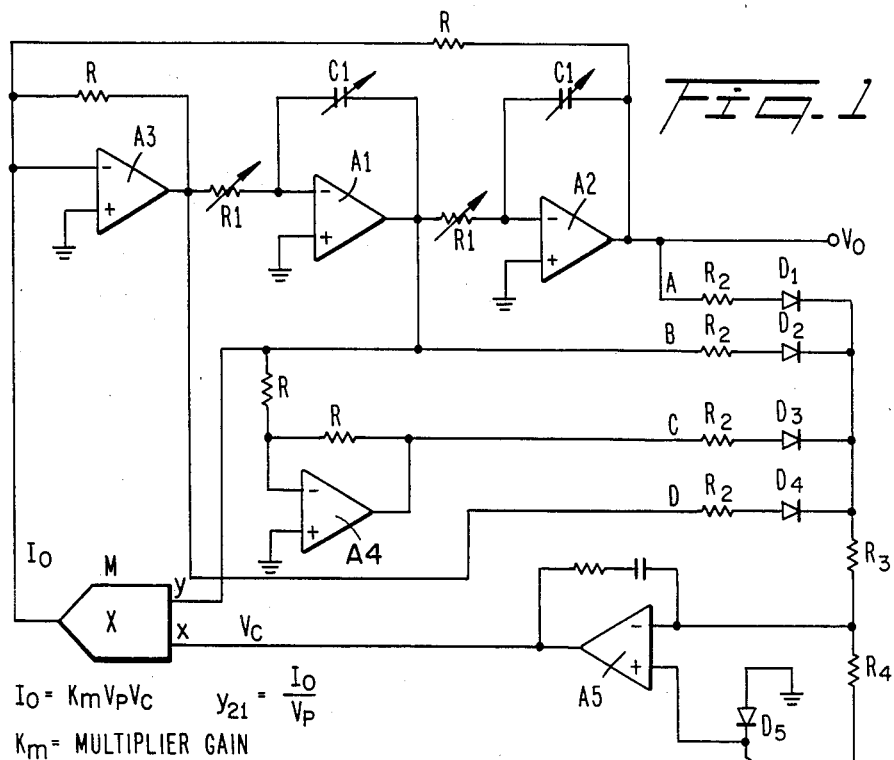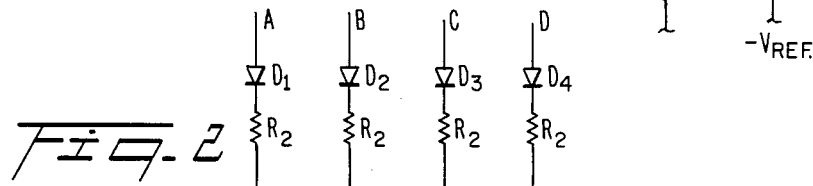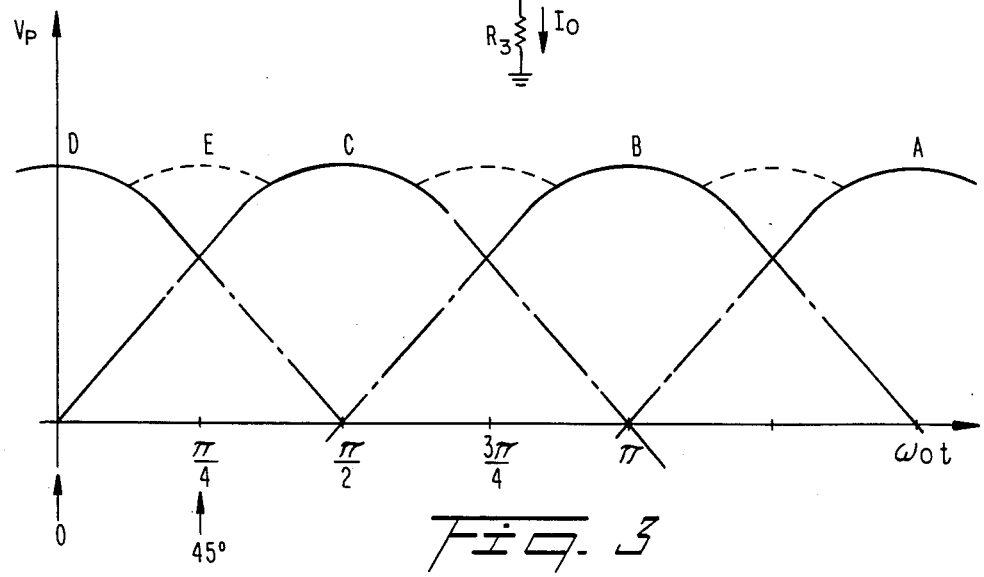

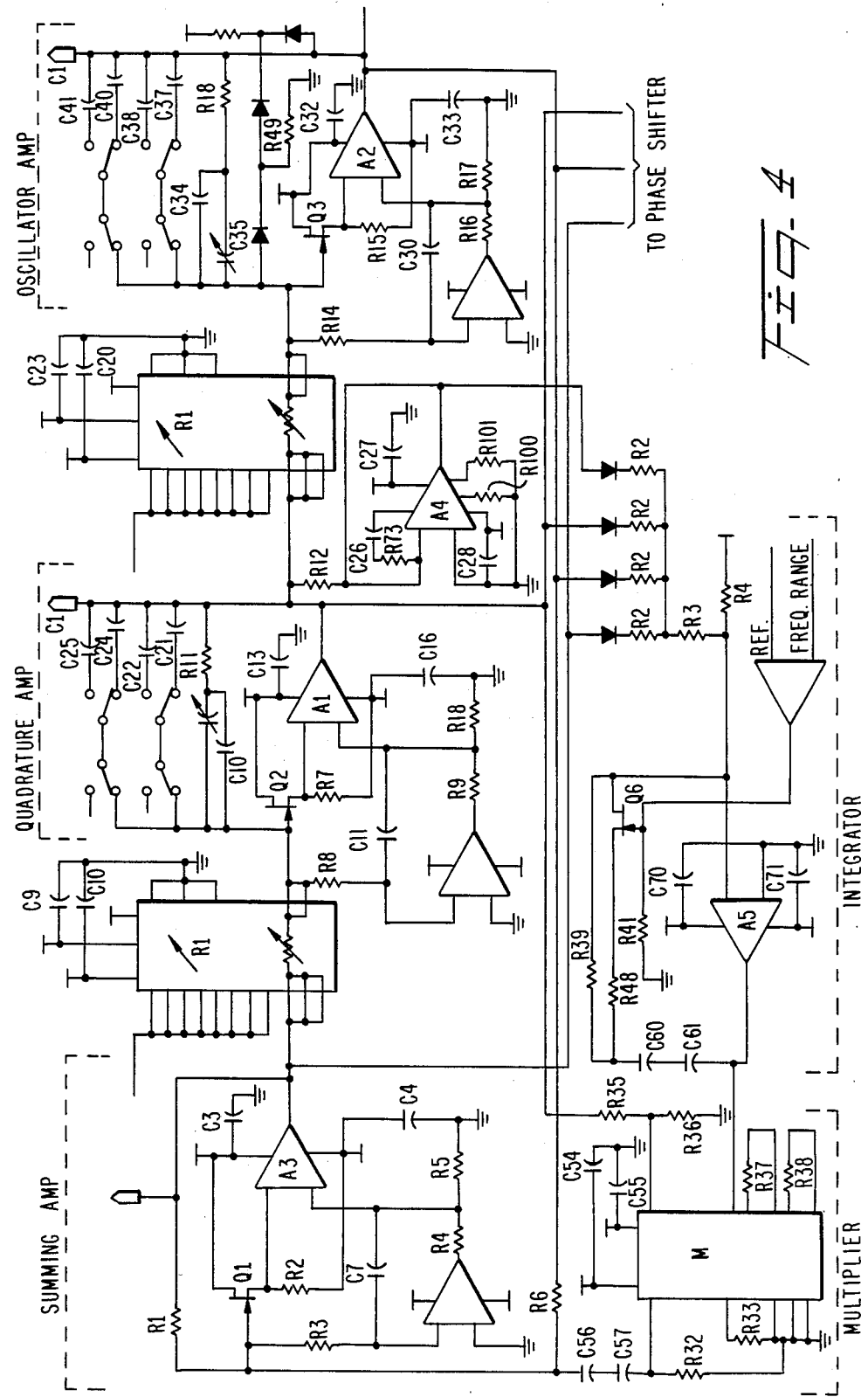

LOW DISTORTION OSCILLATOR

TECHNICAL FIELD

This invention relates to oscillators, and more specifically to amplitude calibrated multiphase oscillators providing a variable frequency output signal, and still more particularly to circuitry for eliminating harmonics from a DC control voltage derived from the various phases of the oscillator output signal in order to reduce ripple in such control voltage.

BACKGROUND ART

Multiphase oscillators are known in the art. More specifically, RC oscillators, utilizing integrators and having adjustable resistance-capacitance values are known in the art. Such oscillators are typically used to generate user selectable, adjustable, frequency signals.

The multiphase oscillators of the prior art typically include circuitry for generating a number of signals, at a particular frequency and at a particular phase. In order to calibrate the amplitude of the output signal, a DC control voltage is applied to a voltage-controlled attenuator or other voltage controlled amplitude regulating device.

To obtain the DC voltage it is known to combine various phases of the generated signal. The various phases are typically combined by addition in a summing stage, to produce the output signal. The process of addition of the different phase signals, as well as other facets of signal generation in the prior art multiphase oscillators such as different methods for producing an appropriate loop gain, typically introduces harmonic distortion to the DC control signal derived from the various phases of the output signal.

There is thus a need in the prior art for methods or apparatus for reduction of the harmonic distortion in an output DC signal generated by combining phases of a variable frequency signal generated by an oscillator.

Prior art techniques for reduction of harmonic content of a DC signal are known.

In one such technique, a pair of squaring circuits is used in an amplitude detector to generate a cosine-squared and a sine-squared signal at a particular frequency. The resultant squared signals are summed to obtain a constant, DC, level having no AC component for comparison in a unity gain feedback circuit of a quadrature type oscillator.

However, such an approach, while theoretically useful, is impractical. The cost of multipliers (and squaring circuits) is substantial and thus mitigates against use of the sum-of-squares approach.

Accordingly, there is a need in the prior art for inexpensive, easily fabricated, practical circuits for reduction of harmonic content of DC signals generated from an oscillator output signal.

In another prior art approach, it is known to obtain the desired DC voltage by combining four phases of a signal, spaced apart by 90°, generated by a double integrating RC oscillator. In this approach, instead of using a half-wave rectifier to obtain the DC control signal, the four phases are summed by a circuit including four input diodes. The circuit provides an output whose amplitude at any one instant is the most positive of the four signals. Thus, the circuit functions to reduce the harmonic content of the DC control signal in comparison to earlier half-wave rectifier techniques for generating the control signal. However, the prior art, although successful in reducing some of the harmonic content of the control signal, provides output DC signals which contain ripple distortion at frequencies as low as the fourth harmonic. While reduction of the harmonic content by elimination of harmonics below the fourth is an advantage, the remaining harmonics nonetheless contribute to additional distortion at a level which is unacceptable for more precise applications.

The prior art thus fails to provide an economical, practical, circuit capable of successfully eliminating a large number of harmonics from a DC control signal, and thus of significantly reducing the total harmonic distortion of the signal to a level acceptable for high precision applications. There is thus a need for circuitry which simply and efficiently eliminates a large number of harmonics from a DC control signal, and accordingly eliminates substantial amounts of harmonic distortion from a control signal generated from oscillator signals.

More specifically, there is a need for practical circuitry capable of reducing or eliminating harmonic distortion in DC signals derived from an oscillator. Such circuitry is needed for removing harmonics at frequencies equal to or exceeding the fourth and higher harmonics of the fundamental generaled frequency and more specifically, where the DC signal is synthesized from a sum of N phases, for removing harmonics up to the 2Nth harmonic when $N>2$.

DISCLOSURE OF INVENTION

It is accordingly an object of the present invention to overcome the difficulties of the prior art and to provide an economical circuit for practical reduction of harmonic distortion in a DC control signal synthesized from phases of an oscillator output signal.

It is a more specific object of the invention to provide an arrangement for reduction of harmonic content of signals generated by double integrating oscillators.

Yet a more detailed object of the invention is the minimization of harmonic distortion in a control signal provided from four phases of a double integrating oscillator.

An additional object of the invention is the elimination from a DC signal, synthesized from four phases of an oscillator output signal, of all harmonics below the eighth harmonic of a fundamental frequency of the output generated by the oscillator.

It is a more general object of the invention to eliminate from a control signal all harmonics below the 2Nth harmonic of an output signal generated by an oscillator, when the control signal is synthesized from N phases of the output signal.

In accordance with the foregoing objects, there is provided an improved amplitude regulated oscillator circuit generating an output signal at a predetermined fundamental frequency. The improvement of the oscillator comprises a first means for synthesizing a DC voltage from N phases of the output signal of the oscillator circuit, where N is an integer, and a second means for substantially eliminating from the synthesized DC voltage harmonic distortion at frequencies below a 2Nth harmonic of the fundamental frequency of the oscillator circuit.

The first means may comprise N diodes, each connected for transmitting to a common point a voltage representing a phase displaced representation of the output signal. The second means may comprise an input resistance connected to each of the diodes, the input resistance having a value for substantially eliminating harmonic distortion below the 2Nth harmonic.

Preferably, the second means also includes an output resistance connected from the common point, the output resistance and the input resistance having a predetermined ratio selected for substantially eliminating the harmonic distortion below the 2Nth harmonic. Additionally, the first means comprises an amplifier receiving a voltage from the common point, the amplifier combining the voltage with a reference value to produce a voltage which is substantially free of harmonic distortion below the 2Nth harmonic.

The first means may further include a multiplier for multiplying a second voltage, which is a function of the common point voltage, by an input voltage to one of the diodes to produce an AC current proportional to a DC control voltage. The AC current is used to adjust the total phase shift around the loop to 360 degrees in order to provide stable oscillation.

In accordance with another aspect of the invention, there is provided a circuit for generating a rectified DC voltage from an oscillating voltage, and for significantly reducing harmonic distortion in the DC voltage. The circuit includes a first means for obtaining a plurality of N signals each comprising a different phase shifted form of the oscillating voltage, and a second means for combining the N signals and for providing a resulting rectified voltage having a time varying magnitude substantially equal at any time to the largest magnitude of any of the N signals at that time. Additionally, a third means is provided for significantly reducing harmonic distortion in the rectified voltage below a 2Nth harmonic of the oscillating voltage.

In the recited circuit, the second means preferably comprises a plurality of diodes connected for receiving the N phase shifted signals and for providing a common output voltage. The third means comprises a resistance included in series with each of the plurality of diodes. The common output voltage is output to a summing resistance and the summing resistance and the series resistance are provided a predetermined ratio to minimize the harmonic distortion. To eliminate the undesired harmonics, the series resistance of each diode may be approximately equal to the summing resistance multiplied by the square root of two.

Alternatively, in order to take into account any voltage drops in the conducting diodes, the series resistance of each diode is taken to be larger than the summing resistance by a factor which varies with the value of the common output voltage.

In accordance with yet another aspect of the invention, there is provided an improvement in a multiple integrating oscillator circuit. The multiple integrating circuit includes at least first and second integrators and at least one inverting amplifier, each connected to provide one of N phase shifted signals, where N is an integer. Each of the N phase shifted signals is substantially equal to an output voltage of the oscillator circuit, and an N diode combining circuit is included for logically summing the N phase shifted signals so as to provide a rectified output voltage having a DC component and at least an Nth and a 2Nth harmonic of the output voltage.

The improvement to the circuit comprises a circuit for reducing the Nth harmonic by eliminating from the rectified output voltage an Nth harmonic component having cusps at the Nth harmonic, and by providing instead a component having cusps occurring at least at the 2Nth harmonic frequency. To attain the desired result, the circuit includes series impedances in series with each of the N diodes.

Preferably, the N diodes provide the rectified output voltage to a summing impedance. The series impedance and the summing impedance have a predetermined ratio to replace the Nth harmonic cusp component by the 2Nth harmonic cusp components.

In accordance with the illustrated preferred embodiment of the invention, the integer N is four so that four phase signals are used. Further, the circuit is a double integrator oscillator, including two integrators and two inverting amplifiers therein for providing the four phase signals. Moreover, the series and summing impedances are provided as a first resistance, provided for each of the four diodes, and a second resistance.

Ideally, the first resistance has a value equal to the value of the second resistance multiplied by the square root of two. For situations in which non-ideal diodes are used and in which voltage drops occur across the diodes during operation, the value of the first resistance is at least equal to the square root of two times the second resistance. More specifically, the first resistance has a value larger than the second resistance by a factor which is dependent on the amplitude of the rectified output voltage.

Other objects, features and advantages of the present invention will become readily apparent to those skilled in the art from the following description wherein there is shown and described a preferred embodiment of the invention, simply by way of illustration and not of limitation of one of the best modes (and alternative embodiments) suited to carry out the invention. As will be realized upon examination of the specification and from practice of the same, the present invention is capable of still other, different, embodiments and its several details are capable of modifications in various obvious aspects, all without departing from the invention. Accordingly, the drawings and the descriptions provided herein are to be regarded as illustrative in nature and not as restrictive of the invention.

BRIEF DESCRIPTION OF THE DRAWING

FIG. 1 shows a sketch of a dual integrator type of oscillator circuit incorporating the present invention;

FIG. 2 shows a circuit embodying the present invention forming a detail of the oscillator circuit of FIG. 1;

FIG. 3 shows waveforms occurring in the oscillator circuit of FIG. 1 for explanation of operation of the circuit embodying the invention; and FIG. 4 shows a detailed circuit diagram of the oscillator circuit of FIG. 1.

DETAILED DESCRIPTION OF A PREFERRED EMBODIMENT OF THE INVENTION

Referring now to the circuit of FIG. 1, there is illustratively shown a dual integrator oscillator circuit incorporating the inventive concept.

In the circuit, amplifiers A1 and A2 are connected as inverting integrators having variable capacitors C1 and variable resistors R1 for determining the frequency of the output voltage Vo, as known in the art. Each amplifier provides 90° phase shift and a 20 db/octave slope. The resistors R1 may be varied to provide frequency variation over a range of a decade, while capacitors C1 may be switched to provide five decade frequency variation.

An amplifier A3 is connected as a unity gain inverting stage, providing another 180° phase shift, to provide a total phase shift of 360° around the loop. For reasons which will be understood from the following description, a fourth amplifier, A4, is added to the circuit, to generate a signal having a fourth phase shift, 270°. Amplifier A4 is not used in the oscillating loop, but rather is used to provide a fourth phase shifted signal which, when combined with the three signals naturally present in the dual integrating amplifier, provides four equally shifted, mutually phase displaced, signals usable in the inventive circuit.

All circuits are adjusted to provide output signals at a substantially common amplitude at the frequency of oscillation.

In a prior art circuit, the output voltage Vo is calibrated, or amplitude controlled, by controlling the amplitude of a feedback DC control voltage for a voltage controlled attenuator or similar circuit.

In the prior circuit the four phase voltage signals are summed, or logically combined, in a four diode circuit including diodes D1, D2, D3 and D4. These diodes combine the four mutually phase displaced signals and provide a common output voltage at an output summing resistor R3. By feeding the voltages directly to the diodes, it is known that the four phase summing circuit operates as a magnitude comparator, similar to a logic OR circuit in which the highest instantaneous voltage magnitude of the four input voltage magnitudes is reproduced across R3.

The prior art circuit is known to reduce harmonic distortion of the control signal from previously known levels obtained by using half wave rectification. Thus, the prior art circuit was found to provide approximately a 25-fold reduction in distortion-settling time product. However, to obtain such an improvement the four voltages were provided to the four diodes directly, without any intervening series resistors R2. In such a circuit, the spectrum of the voltage developed across R3 has been shown to be $$V = \frac{4\sqrt{2}\, V_{pk}}{\pi} \left[ \frac{1}{2} + \frac{1}{15} \cos 4w_o t - \frac{1}{63} \cos 8 w_o t + \ldots \right] \quad (1)$$

In accordance with the present invention, the distortion-settling time product is further improved by a 23 fold factor. If longer settling times are tolerable, then distortion may be reduced still further. However, in order to optimize both settling time and distortion, the present invention eliminates lower order harmonics which are included in the DC control signals fed back by the prior art.

The above figures are illustrative only, and are indicative of operation of the dual-integrator, four-phase feedback control circuitry of FIG. 1. If additional phases were provided and combined to form the DC control signal, harmonic content of the synthesized DC control signal may be reduced still further.

As shown in FIG. 1, the voltages combined by the diodes D1-D4 produce a voltage which is developed across R3, and this voltage is summed with a DC reference signal $-V_{ref}$ at an input node of an inverting summing error integrating amplifier A5. Therein the difference between the DC reference and the synthesized four-phase DC control voltage is measured. Diode D5, shown in the Figure, provides first order cancellation of the effects of the ON voltage of diodes D1-D4.

Loop phase shift is changed by a multiplier M in order to conform to the requirements for oscillation and to obtain a stable sine wave oscillation. The multiplier provides an output AC current used to adjust the total phase shift around the loop to a value of 360 degrees, in order to provide stable oscillation. The current is obtained to be proportional to a product of the output of the amplifier A5 and a quadrature signal present in the oscillator.

As noted from equation (1) above, the prior art provides a spectrum at the output of the four-phase DC synthesizer which includes a desired DC value, a fourth harmonic, an eighth harmonic, etc. In the present invention, however, by providing resistors R2 in series with the diodes, the resistors being substantially equal, and the resistors R2 each being approximately equal to R3 multiplied by the square root of two, the fourth harmonic is eliminated, so that the lowest harmonic of the DC control voltage is the eighth harmonic. Since the integrators of the circuit themselves filter out higher harmonics, the elimination of the lowest harmonic provides a significant reduction in the distortion of the DC control voltage and thus in the accuracy of calibration of the amplitude of the output voltage Vo.

Thus, the oscillator circuit of FIG. 1 may be used to generate an AC signal, for AC calibration of a multi-function calibrator apparatus, for example.

Referring now to FIG. 2, the circuit incorporating the inventive concept is shown in greater detail. Therein, the order of connection of the diodes and resistors R2 is shown reversed for clarity of operation. However, reversal of the order does not affect implementation of the invention. Operation of the circuit to eliminate a fourth harmonic component of the combined voltage may be understood from the following explanation, which relies on the waveforms shown in FIG. 3.

It is first noted that at the fundamental oscillating frequency $w = 1/(RC)$, both integrators A1 and A2 will have a unity gain, so that all four signals A, B, C and D impressed on the diodes D1-D4 are of equal magnitudes and 90° apart, as shown by the four curves of FIG. 3. In view of cancellation of the diode drops by diode D5 as above mentioned, and further in view of termination of R3 at a summing node, the circuit of FIG. 2 may be used to represent the current Io in R3 under the assumption that diodes D1-D4 are ideal.

As is seen from the voltage curves of FIG. 3, and as will be appreciated from knowledge of the manner of operation of the four-phase summing circuit, the output voltage across resistor R3 will tend to undertake the form represented by the solid curve of FIG. 3, representing the maximum instantaneous value of the four combined voltages. Thus, $$V_{R3} = \max\{V_A, V_B, V_C, V_D\}. \quad (2)$$

However, as will be appreciated by those skilled in the art, this voltage shows significant variations at the fourth harmonic of the fundamental frequency, as illustrated by the significant cusps of the voltage across resistor R3.

In view of the connection of resistor R3 to a virtual ground at the summing node of amplifier A5, however, it will be understood that some current will flow through a diode connected to a positive voltage even when that voltage is not the maximum voltage indicated by Equation (2). Thus, the current Io in resistor R3 may be calculated as the sum of the currents in each diode by consideration of the voltage applied at the input terminals to the diodes of FIG. 2.

The following considerations are provided in determining the current flowing through resistor R3 at two points in time, representing a peak and a cusp of the voltage illustrated by the solid line of FIG. 3. For illustrative purposes, the two specific time points 0° and 45° are considered.

At time 0, $V_A=V_C=0$, while $V_B=-V_p$ and $V_A=V_p$. Thus, at time 0, Io is simply equal to the current in diode D4. This current is given by $$Io' = V_A/(R2+R3) = V_p/(R2+R3). \quad (3)$$

At time 45°, $V_A=V_B=-V_p/\sqrt{2}$, while $V_C=V_D=V_p/\sqrt{2}$. Thus, at time 45°, Io is equal to the sum of the currents in diodes D3 and D4. This current is given by $$Io'' = V_C/(R3+R2/2) = \sqrt{2} V_p/(R2+2R3). \quad (4)$$

In order to cause the voltage across resistor R3 to remain more nearly constant and to reduce harmonic distortion thereof, the present invention provides non-zero values of both R2 and R3. The presence of both resistors R2 and R3 in the circuit permits an adjustment to be made which causes the currents Io' and Io'' of Equations (3) and (4) to equal one another. Thus, by forcing the same current to flow through resistors R3 at times when otherwise the voltage across the resistor would be at different extremes of value, illustrated by a peak and a cusp in FIG. 3, the voltage at both times is instead forced to equal the peak value Vp at both times.

From Equations (3) and (4), if Io' and Io'' are equal then $$R2 = \sqrt{2} R3. \quad (5)$$

Accordingly, for a specific ratio between R2 and R3, the same voltage can be caused to appear across R3 during the time when cusps are expected in the waveform of FIG. 3 and during the time when peaks are expected in that waveform.

Accordingly, by using resistance values R2 and R3 conforming to equation (5) the waveform of the actual synthesized DC voltage across resistor R3 follows the dashed line labelled E in FIG. 3. As thus seen, the amplitude variation in the DC voltage produced by using the circuit of FIG. 2 in the manner shown in FIG. 1 is significantly reduced from the large deviations between the peaks and valleys of the solid line waveform of FIG. 3. Moreover, the waveform is seen to have a cusped portion recurring at a frequency equal to the eighth harmonic, rather than the fourth harmonic, of the fundamental frequency.

Thus, the present invention has removed the fourth harmonic and instead has injected a current resulting in a harmonic distortion which, at its lowest harmonic, depends on the eighth harmonic of the fundamental.

A somewhat different result obtains if the ON diode drop of the diodes D1–D4 is taken into consideration. When this drop is included in the considerations leading to equations (3) and (4), it is seen that, for a diode drop of 0.7 volts, at time 0, $$Io' = (V_A - 0.7)/(R2+R3) = (V_p - 0.7)/(R2+R3). \quad (6)$$

while at time 45°, Io'' is given by $$Io'' = (V_C - 0.7)/(R3+R2/2) = (\sqrt{2} V_p - 1.4)/(R2+2R3). \quad (7)$$

Similarly to the previous approach, presence of both R2 and R3 enables Io' and Io'' to be forced to equal each other. In this instance, however, the peak value Vp of the applied voltage phases remains a factor of the relationship imposed by equating the results of equations (6) and (7). As an illustrative example, for a value of Vp=7.24 volts, there results a relationship wherein R2=1.843 R3. Although this value differs from the result of Equation (5), nonetheless it is seen that a similar result pertains in both instances.

In accordance with the invention, there is thus provided a ratio between the series input resistance of the four diodes and the output, or summing, resistance connected thereto in order to remove from the synthesized DC control signal all harmonic distortion below the eighth harmonic of the signals being summed thereby. The relationship between the two resistance values for ideal diodes is fixed at a ratio which depends on the amplitude of the waveforms at their intersection in the curves of FIG. 3. Thus, for combinations of different numbers of phased signals the relationship between R2 and R3 will differ. Moreover, when practical characteristics of the diodes are considered, the relationship differs somewhat from the ideal, depending to some extent on the magnitude of the voltages being summed.

It is further noted that the resistance R4, shown in FIG. 1 and used to provide from the reference voltage to the amplifier A5 a negative and equal current to that provided via resistors R2, may be determined from the following equation upon similar consideration as used to obtain the previous equations:

$$R4/(R2+R3) = 12/0.9745(7.24-0.7) = 1.883. \quad (8)$$

Referring now to FIG. 4, there is shown a detailed circuit diagram embodying the illustrative circuit of FIG. 1. The circuit of FIG. 4 includes each of the components of FIG. 1, and illustrates the use of 8 bit digitally variable resistors in chips U5 and U7 for the resistances R1, as well as integrated, switchable, capacitors for the capacitances C1.

The diodes CR1, CR2, CR3 and CR4 provide the appropriate signal mixing to generate the synthesized DC signal having harmonics only above the eighth harmonic of the fundamental signal. Chip U16 is a multiplier, driven by the inverting summing error integrator of chip U18. Chips U4, U14 and U15 are DC amplifiers which are included to keep the DC offset of the output of the oscillator as close as possible to zero. Transistors Q1, Q2 and Q3 at the inputs to amplifiers A3, A1 and A2, respectively minimize the effect of bias current caused by the amplifiers for low frequencies.

It is noted that the circuit of FIG. 4 implementing the invention is provided with a range of operation from 10 Hz to 1.2 MHz. The circuit is most useful at the low frequency end, wherein a low distortion is provided together with quick stabilization after changes in resistance or capacitance values.

In accordance with the invention, it is thus seen that a diode magnitude comparison (or logic summing) circuit having specified resistances therein causes a result of combining N phases of a signal to simulate a combination of 2N phases, thus eliminating the Nth harmonic from the combination. Where the phases are equally displaced from one another, and the resistances R2 are all equal, a combination of four phases of a signal is made to appear as an eight phase combination with a 45° separation between the phases and with substantially perfect cancellation of fourth harmonic distortion.

A mathematical Fourier analysis confirms the above described results, wherein equal resistances R2 provide equal weighting to each of the combined phases. While a circuit is known in which R3 is present but resistors R2 are zero, and while another circuit uses non-zero resistors R2 but with zero resistance for R3, the present circuit combines non-zero values of both R2 and R3 to obtain previously unexpected results and to cancel the lower harmonics upon assigning a proper relationship between the resistance values.

The circuit has been built and tested, and results have been obtained verifying the above described operation. Distortion in the constructed circuit is so low that other factors, such as voltage coefficients of resistors and the like, must be considered to obtain complete verification.

It will be realized from the foregoing description that the voltage may, but need not, be generated by a double integrating amplifier or by an N/2 integrator circuit. Thus, a voltage produced by any oscillator may be used to synthesize a DC voltage therefrom, with reduced harmonic content. Advantageously, since multiple integrator oscillators include therein several stages, each providing separate phase shifted signals, and since the double integrator shown in the present figures provides 3 phase shifted versions of the output voltage, at +90°, −90°, and 180°, the voltages may be combined with minimal additional circuitry to produce the DC voltage.

In accordance with the invention, the reduction of harmonic content of a synthesized DC voltage is more easily achieved by use of equally shifted, mutually phase displaced signals. Thus, if three signals were combined, the relative phase shifts should preferably be 120°, 240° and 360° (or zero). To use the three phase shifted signals available in the oscillator of FIG. 1, a fourth signal, at a phase shift of 270°, is introduced, to obtain four equally shifted, mutually phase displaced signals.

As will be further apparent from the previous description of the theory explaining operation of the device, where N phase shifted signals are used, the signals should be shifted from one another by 360°/N.

The foregoing description of the preferred embodiment of the invention has been presented for purposes of illustration and description and is not intended to be exhaustive or to limit the invention to the precise forms disclosed, since many modifications and variations are possible in light of the above teaching. The embodiment was chosen and described in order best to explain the principles of the invention and its practical application, thereby to enable others skilled in the art best to utilize the invention in various embodiments and with various modifications as are suited to the particular use contemplated therefor. It is intended that the scope of the invention be defined by the claims appended hereto, when interpreted in accordance with full breadth to which they are legally and equitably entitled.

I claim:

1. In an amplitude regulated oscillator circuit generating an output signal at a predetermined fundamental frequency, the improvement comprising:
   first means for synthesizing a DC voltage from N phases of the output signal of the oscillator circuit, where N is an integer, and
   second means for substantially eliminating from the DC voltage synthesized from the output signal of the oscillator harmonic distortion at frequencies below a 2Nth harmonic of the fundamental frequency of the oscillator circuit.

2. An improved amplitude regulated oscillator circuit as recited in claim 1, wherein said first means comprises N diode means each connected for transmitting to a common point a voltage representing a phase displaced representation of the output signal.

3. In an amplitude regulated oscillator circuit generating an output signal at a predetermined fundamental frequency, the improvement comprising:
   first means for synthesizing a DC voltage from N phases of the output signal of the oscillator circuit, where N is an integer, and
   second means for substantially eliminating from the DC voltage synthesized from the output signal of the oscillator harmonic distortion at frequencies below a 2Nth harmonic of the fundamental frequency of the oscillator circuit,
   said first means comprising N diode means each connected for transmitting to a common point a voltage representing a phase displaced representation of the output signal,
   said second means comprising input resistance connected to each of said diode means, said input resistance have a value for substantially eliminating harmonic distortion below said 2Nth harmonic.

4. An improved amplitude regulated oscillator circuit as recited in claim 2 wherein said second means comprises input resistance provided to each of said diode means and output resistance connected from said common point, said output resistance and said input resistance having a predetermined ratio for substantially eliminating said harmonic distortion below said 2Nth harmonic.

5. An improved amplitude regulated oscillator circuit as recited in claim 4 wherein said first means further comprises amplifying means receiving a voltage from said common point, said amplifying means combining said voltage from said common point with a reference value to produce a comparison voltage substantially free of harmonic distortion below said 2Nth harmonic.

6. An improved amplitude regulated oscillator circuit as recited in claim 5 wherein said first means further comprises multiplying means for multiplying said comparison voltage by an input voltage to one of said diode means to produce a signal for adjusting total phase shift to a value providing stable oscillation of the oscillator circuit.

7. An improved amplitude regulated oscillator circuit as recited in claim 5 wherein said first means further comprises multiplying means for multiplying a second voltage, which is a function of said common point voltage, by a quadrature signal present in the oscillator circuit to produce a signal for adjusting total phase shift to a value providing stable oscillation of the oscillator circuit.

8. An improved amplitude regulated oscillator circuit as recited in claim 2 wherein said second means comprises input resistance provided to each of said diode means and output resistance connected from said common point, said output resistance and said input resistance having a predetermined ratio for significantly reducing said harmonic distortion below said 2Nth harmonic.

9. Circuit for generating a rectified DC voltage from an oscillating voltage, and for significantly reducing harmonic distortion in said DC voltage, comprising:
   first means for obtaining a plurality of N signals each comprising a different phase shifted form of said oscillating voltage,
   second means for combining said N signals and for providing a resulting rectified voltage having a time varying magnitude substantially equal at any time to the largest magnitude of any of said N signals at that time, and
   third means for significantly reducing harmonic distortion in said rectified voltage below a 2Nth harmonic of said oscillating voltage.

10. A circuit as recited in claim 9 wherein said second means comprises a plurality of diodes connected for receiving said N phase shifted signals and for providing a common output voltage.

11. A circuit for generating a rectified DC voltage from an oscillator voltage, and for significantly reducing harmonic distortion in said DC voltage, comprising:
   first means for obtaining a plurality of N signals each comprising a different phase shifted form of said oscillating voltage,
   second means for combining said N signals and for providing a resulting rectified voltage having a time varying magnitude substantially equal at any time to the largest magnitude of any of said N signals at that time, and
   third means for significantly reducing harmonic distortion in said rectified voltage below a 2Nth harmonic of said oscillating voltage,
   said second means comprising a plurality of diodes connected for receiving said N phase shifted signals and for providing a common output voltage,
   said third means comprising resistance included in series with each of said plurality of diodes.

12. A circuit as recited in claim 10 wherein said common output voltage is output to a summing resistance and said third means comprises series resistance included in series with each of said plurality of diodes, said summing resistances and said series resistance are provided a predetermined ratio to minimize said harmonic distortion.

13. A circuit as recited in claim 12 wherein said series resistance of each diode is approximately equal to said summing resistance multiplied by the square root of two.

14. A circuit as recited in claim 12 wherein said series resistance of each diode is taken to be larger than said summing resistance by a factor which varies with the value of said common output voltage.

15. In a multiple integrating oscillator circuit including at least first and second integrators and at least one inverting amplifier, each connected to provide one of N phase shifted signals, where N is an integer, each of said N phase shifted signals substantially equal to an output voltage of said oscillator circuit, and further including an N diode combining circuit for logically summing said N phase shifted signals so as to provide a rectified output voltage having a DC component and harmonics of said output voltage including at least an Nth and a 2Nth harmonic, the improvement comprising:
   circuit means for reducing said Nth harmonic by eliminating from said rectified output voltage an Nth harmonic component having cusps at said Nth harmonic and by replacing said component by a component having cusps occurring at least at said 2Nth harmonic frequency,
   said circuit means comprising series impedance means in series with each of said N diodes.

16. An improved multiple integrating oscillator circuit as recited in claim 15 wherein said N diodes provide said rectified output voltage to a summing impedance, said series impedance and said summing impedance having a predetermined ratio to replace said Nth harmonic cusp component by said 2Nth harmonic cusp components.

17. An improved multiple integrating oscillator circuit as recited in claim 16 wherein said integer N is four, said circuit comprising two integrators therein and two inverting amplifiers for providing four phase signals, and wherein said series impedance comprises a first resistance provided for each of said four diodes and said summing impedance comprises a second resistance.

18. An improved multiple integrating oscillator circuit as recited in claim 17 wherein said first resistance has a value larger than said second resistance by a factor dependent on the amplitude of the rectified output voltage.

19. An improved multiple integrating oscillator circuit as recited in claim 17 wherein said first resistance has a value at least equal to the value of said second resistance multiplied by the square root of two.

* * * * *